(12) United States Patent
Ju et al.

(10) Patent No.: US 10,749,501 B2
(45) Date of Patent: Aug. 18, 2020

(54) HIGH POWER SILICON ON INSULATOR SWITCH

(71) Applicant: Integrated Device Technology, Inc., San Jose, CA (US)

(72) Inventors: Hojung Ju, San Diego, CA (US); Roberto Aparicio Joo, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 16/196,165

(22) Filed: Nov. 20, 2018

(65) Prior Publication Data

US 2019/0158066 A1 May 23, 2019

Related U.S. Application Data

(60) Provisional application No. 62/589,898, filed on Nov. 22, 2017.

(51) Int. Cl.
| | | |
|---|---|---|
| *H03K 3/03* | (2006.01) | |
| *H03H 11/06* | (2006.01) | |
| *H03H 11/34* | (2006.01) | |
| *H04B 1/48* | (2006.01) | |
| *H03K 17/041* | (2006.01) | |
| *H03K 17/10* | (2006.01) | |
| *H03K 17/06* | (2006.01) | |

(52) U.S. Cl.
CPC .......... *H03H 11/06* (2013.01); *H03H 11/348* (2013.01); *H03K 17/04106* (2013.01); *H03K 17/102* (2013.01); *H04B 1/48* (2013.01); *H03K 2017/066* (2013.01); *H03K 2217/0054* (2013.01)

(58) Field of Classification Search
CPC .... H03H 11/06; H03H 11/348; H03K 17/102; H03K 17/04106; H03K 2017/066; H03K 2217/0054; H04B 1/48
USPC .......................................................... 331/46
See application file for complete search history.

(56) References Cited

U.S. PATENT DOCUMENTS

| | | | |
|---|---|---|---|
| 5,697,069 A | 12/1997 | Bohm et al. | ..................... 455/83 |
| 8,886,136 B1 | 11/2014 | Signoff et al. | .................. 455/78 |
| 9,312,853 B2 * | 4/2016 | Sigetani | ................... H04B 1/48 |
| 2004/0242182 A1 * | 12/2004 | Hidaka | .................... H04B 1/44 |
| | | | 455/333 |

(Continued)

OTHER PUBLICATIONS

Tokumitsu, "A low-Voltage, High-Power T/R-Switch MMIC Using LC Resonators", IEEE Transactions on Microwave Theory and Techniques, vol. 43, May 1995; pp. 997-1003.

*Primary Examiner* — Richard Tan
(74) *Attorney, Agent, or Firm* — Christopher P. Maiorana, PC

(57) ABSTRACT

An apparatus comprises a first RF port, a second RF port, a first resonator circuit and at least one second resonator circuit. The first resonator circuit and the second resonator circuit may be connected between the first RF port and the second RF port. The first resonator circuit may comprise a first inductor, a first capacitor, and a first stacked switch device. The second resonator circuit may comprise a second inductor, a second capacitor, and a second stacked switch device. The first capacitor and the first stacked switch device may be coupled in series across the first inductor. The second capacitor, the second inductor, and the second stacked switch device may be connected in parallel.

20 Claims, 12 Drawing Sheets

(56) References Cited

U.S. PATENT DOCUMENTS

2015/0318890 A1    11/2015  Uejima
2016/0182037 A1*   6/2016   Srihari .................... H04B 1/48
                                                          343/858

* cited by examiner

HALF SUPPLY BIASED

HIGH POWER SILICON ON INSULATOR SWITCH

This application relates to U.S. Provisional Application No. 62/589,898, filed Nov. 22, 2017, which is hereby incorporated by reference in its entirety.

FIELD OF THE INVENTION

The invention relates to wireless communications circuits generally and, more particularly, to a method and/or apparatus for implementing a high power silicon on insulator (SOI) switch.

BACKGROUND

In wireless communications systems, a front-end module (FEM) provides an interface between an antenna and an RF transceiver. A FEM typically includes power amplifiers, switches, low-noise amplifiers, control circuitry, and passive elements. Radio frequency (RF) Silicon on Insulator (SOI) has rapidly evolved as a mainstream technology for switches used in wireless applications. A high power transmit-receive switch with a traditional configuration generally utilizes a large number of large sized stacked devices. Because of the large number and size of the stacked devices, traditional high power switches use a large die area. The large number and size of the stacked devices also has negative effects through substrate loss and parasitic substrate capacitance. Due to large gate capacitance, fast switching time (e.g., <0.5 microsecond) is hard to implement with traditional switches without degradation of insertion loss. Applications with traditional high power switches involve a trade-off between insertion loss and fast switching time through gate resistance. Obtaining a low return loss is also difficult due to large parasitic substrate capacitance.

It would be desirable to implement a high power SOI switch that avoids the negative effects described above.

SUMMARY

The invention concerns an apparatus comprising a first RF port, a second RF port, a first resonator circuit and at least one second resonator circuit. The first resonator circuit and the second resonator circuit may be connected between the common RF port and the second RF port. The first resonator circuit may comprise a first inductor, a first capacitor, and a first stacked switch device. The second resonator circuit may comprise a second inductor, a second capacitor, and a second stacked switch device. The first capacitor and the first stacked switch device may be coupled in series across the first inductor. The second capacitor, the second inductor, and the second stacked switch device may be connected in parallel.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a high power switch that may (i) be implemented using silicon-on-insulator (SOI) technology, (ii) be implemented using complementary metal oxide semiconductor (CMOS) technology, (iii) be integrated with other building blocks as a dedicated application using CMOS technology, (iv) provide small gate capacitance allowing easy implementation of fast switching time (e.g., <0.5 μsec), (v) protect a receive path with an LC resonator, (vi) cascade a number of LC resonators in place of a series receive switch, (vii) determine a number of cascaded resonators and device stack sizes based on a maximum input power, (viii) reduce parasitic substrate capacitance in a receive path, (ix) reduce size of shunt device relative to series device, (x) utilize internal DC blocking capacitors and half supply voltage tabs at both shunt device paths in addition to external DC blocking capacitors on RF ports, (xi) be implemented using discrete electronic components, (xii) implement fast switching time by removing negative and positive supply voltage, (xiii) improve power handling using strong gate bias voltages, (xiv) be implemented as one or more integrated circuits, (xv) be integrated with low noise amplifiers in a receive path, and/or (xvi) be implemented in fifth generation (5G) wireless communication systems.

In wireless systems, a front-end module (FEM) provides an interface between an antenna and an RF transceiver. A FEM typically includes power amplifiers, switches, low-noise amplifiers, control circuitry, and passive elements. Wireless infrastructure, time division duplex (TDD) active antenna systems, and small cell base stations can involve switching high power levels (e.g., 35 dBm) at high frequencies (e.g., >2 GHz). The number of RF switch devices per phone has increased with the shift to 4G, or long-term evolution (LTE), and may be expected to grow with the introduction of 5G applications. A majority of the switches going into cellular (or smart) telephones are Silicon on Insulator (SOI). Although RF switches may utilize a variety of technologies, field effect transistor (FET) switches are typically used in cellular applications to lower power demand and extend battery life.

Figure 1:
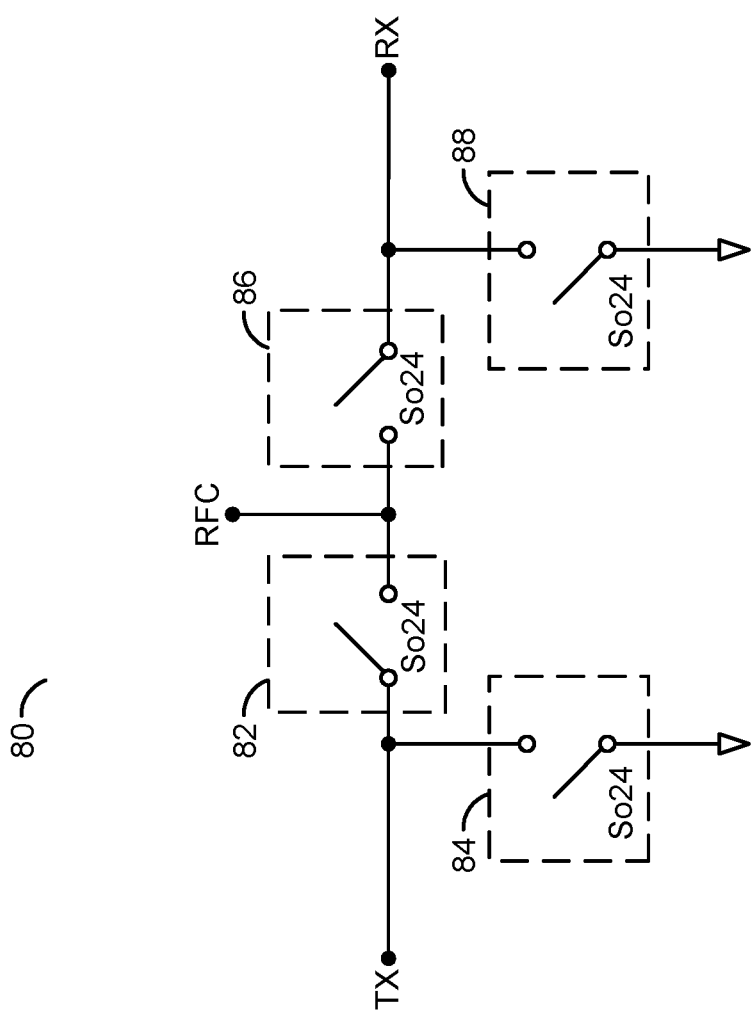
FIG. 1 is a block diagram illustrating a high power silicon on insulator (SOI) switch.

Referring to FIG. 1, a block diagram of a circuit 80 is shown illustrating a high power transmit-receive (TR) switch utilizing a traditional configuration. In an example, the circuit 80 may be implemented using silicon-on-insulator (SOI) technology. However, other technologies may be utilized as well to meet design criteria of a particular implementation. In an example, the circuit 80 may implement a single-pole double throw (SPDT) switch. However, other numbers of poles and/or throws may be implemented accordingly to meet design criteria of particular applications.

In an example, the circuit 80 may comprise a series transmit switch 82, a shunt transmit switch 84, a series receive switch 86, and a shunt receive switch 88. The switches 82, 84, 86, and 88 may be implemented using large numbers (e.g., 24) of series connected (or stacked) devices (e.g., transistors). However, other numbers of stacked devices may be used to meet design criteria of a particular application. The switch 80 generally occupies a large die area due to the high number of stacked devices. The high number of stacked devices making up the switches 82, 84, 86, and 88 generally has negative effects (e.g., through substrate loss and parasitic substrate capacitance due to the large device size and high stacking count).

In various embodiments, the switches 82, 84, 86, and 88 are used to route signals between an RF input port (e.g., TX), an RF output port (e.g., RX), and an RF common port (e.g., RFC). In an OFF state, the switch 86 needs to withstand the high input power levels (e.g., over 40 dBm) generally associated with transmitting wireless communications signals. In the OFF state, the relatively high input voltage is spread out among the individual devices in the stack of the switch 86, reducing the voltage across each individual device, in order to prevent breakdown. Stacking the devices is important because the drain-to-source breakdown voltage ($BV_{DS}$) and the drain-to-gate breakdown voltage ($BV_{DG}$) of a single FET may be on the order of 2 to 4 volts (V) (3.5V typically) depending on the particular process technology.

In an example, an output of a transmit chain may be coupled to a first terminal of the series transmit switch 82 and a first terminal of the shunt transmit switch 84. A second terminal of the series transmit switch 82 may be coupled to the RF common port (RFC) and a first terminal of the series receive switch 86. In an example, the RF common port RFC may be connected to an antenna or a transmission line. A second terminal of the series receive switch 86 may be coupled to a first terminal of the shunt receive switch 88 and the RF output port RX. In an example, an input of a receive chain may be coupled to the RF output port RX. A second terminal of the shunt transmit switch 84 and a second terminal of the shunt receive switch 88 may be coupled to a circuit ground potential.

A traditionally configured high power SOI switch generally utilizes a high number of stacked devices. Because of the high number of stacked devices, traditional high power SOI switches use a large die area. The traditionally configured high power SOI switch generally has negative effects through substrate loss and parasitic substrate capacitance due to the large device size and high stacking. Due to large gate capacitance, fast switching time (e.g., <0.5 microsecond) is hard to implement with traditionally configured switches without degradation of insertion loss. Applications with traditionally configured SOI switches may involve a trade-off between insertion loss and fast switching time through gate resistance. Obtaining a good return loss is also difficult due to large parasitic substrate capacitance.

In an example, the RF input port may be connected to an output end of a transceiver transmit chain and the RF output port RX may be connected to an input end of a transceiver receive chain. In a transmit mode, the series transmit switch 82 is in a conducting state (e.g., closed or ON), the shunt transmit switch 84 is in a non-conducting state (e.g., open or OFF), the series receive switch 86 is in a non-conducting state (e.g., open or OFF), and the shunt receive switch 88 is in a conducting state (e.g., closed or ON). In a receive mode, the series transmit switch 82 is in a non-conducting state (e.g., open or OFF), the shunt transmit switch 84 is in a conducting state (e.g., closed or ON), the series receive switch 86 is in a conducting state (e.g., closed or ON), and the shunt receive switch 88 is in a non-conducting state (e.g., open or OFF). Because of the magnitude of the transmit power, the series receive switch 86 generally needs to have a high breakdown rating to isolate the receive chain during the transmit mode. Because the series receive switch 86 is directly in the signal path of the receive chain, the series receive switch 86 directly contributes to insertion loss (IL) and noise figure (NF) ratings of the receiver input.

Figure 2:
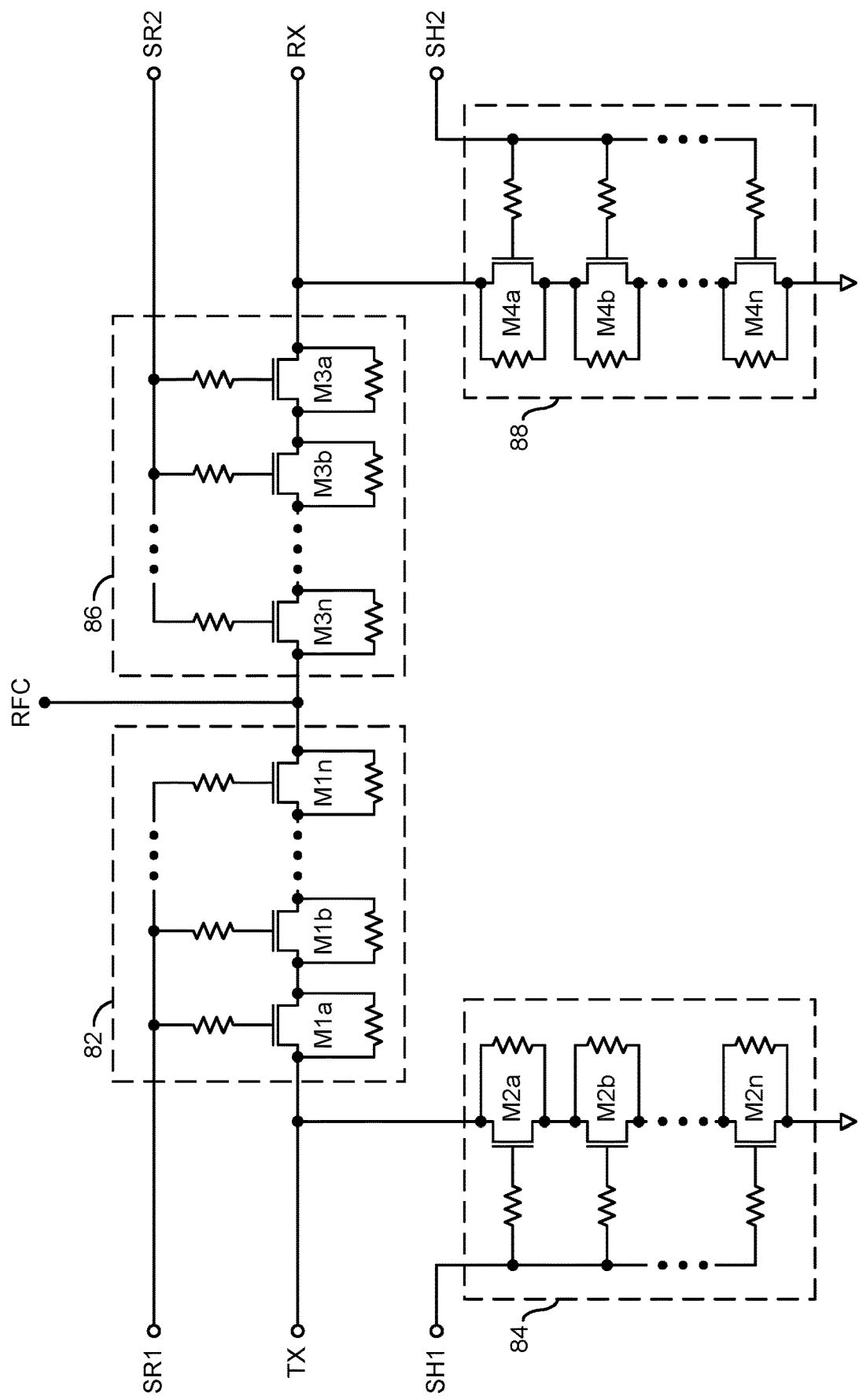
FIG. 2 is a schematic diagram illustrating a stacked device implementation of the high power silicon on insulator (SOI) switch of FIG. 1.

Referring to FIG. 2, a schematic diagram is shown illustrating an example of a stacked device implementation of the high power silicon on insulator (SOI) switch of FIG. 1. In various embodiments, each of the switches 82, 84, 86, and 88 may be implemented as a number of devices (e.g., transistors) stacked in series. In an example, the switch 82 may comprise a number of transistors M1a-M1n, the switch 84 may comprise a number of transistors M2a-M2n, the switch 86 may comprise a number of transistors M3a-M3n, and the switch 88 may comprise a number of transistors M4a-M4n. In an example, the switches 82, 84, 86, and 88 may be implemented as stack-of-24 (So24) devices (e.g., n=24). In an example, the So24 devices may handle a maximum 44 dBm input power.

Field effect transistors (FETs) are typically used in cellular applications to meet low power demands of cellular applications. To handle the relatively high (e.g., tens of volts) RF voltages, the FETs making up the switches 82, 84, 86, and 88 are traditionally stacked. The term stacked is used to describe a configuration where the drain of one transistor is the source of the next transistor.

In an example, the relatively high input voltage is spread out among the individual devices in the stack of the switches 82, 84, 86, and 88, reducing the voltage across each individual device, in order to prevent breakdown. Stacking the devices of the traditional configuration is important because the drain-to-source breakdown voltage ($BV_{DS}$) and the drain-to-gate breakdown voltage ($BV_{DG}$) of a single FET may be on the order of 2 to 4 volts (V) (3.5V typically) depending, on the particular process technology, while the RF signals may be on the order of 20 or more volts. The individual transistors of each stack may also be configured to more evenly distribute the RF voltage. By stacking the devices, the relatively high voltage typically used in most RF front-end modules is dispersed over several (e.g., typically twelve or more), so that the voltage across any one device is relatively small, making breakdown unlikely. Ideally, each of the devices in the stack should have substantially the same drain-to-source voltage. In embodiments implementing a half supply biased configuration (described below in connection with FIG. 9), resistors may be added between the source and drain terminals of each transistor to provide the same DC voltage (bias) level (e.g., VDD/2) to all of the switches.

In an example, each of the switches 82, 84, 86, and 88 receives a control signal (e.g., SR1, SH1, SR2, and SH2, respectively). When the respective control signal is held LOW, the corresponding switch is generally in a non-conducting state (e.g., open or OFF), blocking signals from passing through. When the respective control signal is held HIGH, the corresponding switch is generally in a conducting state (e.g., closed or ON), allowing the signals to pass through. In an example, when the control signals SR1 and SH2 are held HIGH and the control signals SR2 and SH1 are held LOW, the series transmit switch 82 allows signals to pass from the RF input port TX to the common RF port RFC and the shunt receive switch 88 directs signals to ground. When the control signals SR1 and SH2 are held LOW and the control signals SR2 and SH1 are held HIGH, the series receive switch 86 allows signals to pass from the RF common port RFC to the RF output port RX and the shunt transmit switch 84 directs signals to ground.

In some embodiments, the switches 82 and 88 may receive a first control signal and the switches 84 and 86 may receive a second control signal. In various embodiments, the signals SR1, SH1, SR2, SH2 may be derived from a single transmit/receive (T/R) control signal. In an example, a transmit mode may have the signal T/R held HIGH, resulting in the control signals SR1 and SH2 being held HIGH and the control signals SR2 and SH1 being held LOW. In another example, a receive mode may have the signal T/R held LOW, resulting in the control signals SR1 and SH2 being held HIGH and the control signals SR2 and SH1 being held LOW. However, other polarities may be implemented to meet design criteria of a particular implementation.

Figure 3:
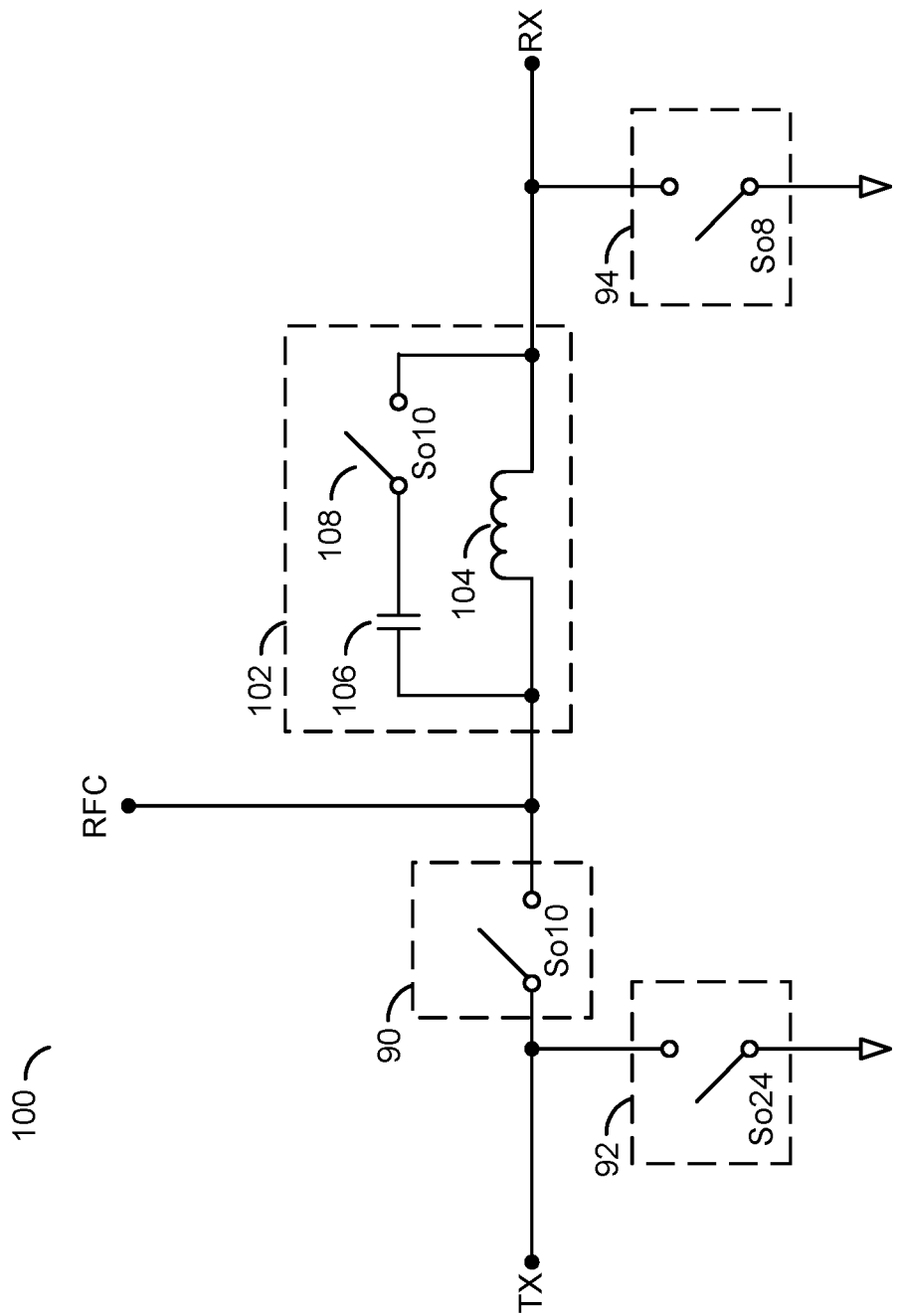
FIG. 3 is a diagram illustrating a high power silicon on insulator (SOI) switch in accordance with an example embodiment of the invention.

Referring to FIG. 3, a diagram of a circuit 100 is shown illustrating a high power switch in accordance with an example embodiment of the invention. In an example, the circuit 100 may be implemented using semiconductor technologies including, but not limited to, silicon-on-insulator (SOI) technology and/or complementary metal oxide semiconductor (CMOS) technology. In various embodiments, the circuit 100 may incorporate a resonator circuit to protect a receive path of a wireless communication system. In various embodiments, the resonator circuit may be used in place of a series receive switch. The resonator circuit may be configured to block (reflect) some portion of the transmit power, allowing smaller devices and/or fewer stacked devices to be used.

In an example, the high power switch circuit 100 may comprise the traditionally configured series transmit switch 90, a traditionally configured shunt transmit switch 92, a circuit 102, and a traditionally configured shunt receive switch 94. In various embodiments, the circuit 102 may comprise an LC resonator circuit. The LC resonator circuit 102 may be configured to protect a receive path of a wireless communication system. In an example, the LC resonator circuit 102 may comprise an inductor 104, a capacitor 106, and a switch 108. The switch 108 may comprise a low number (e.g., 10) of stacked switch devices (e.g., transistors). The circuit 102 generally allows the switch 94 to be implemented with a lower number (e.g., 8) of stacked devices (e.g., transistors) than the shunt receive switch 88 of the traditionally configured switch. In an example, the switch circuit 100 may handle over 40 dBm input power over a frequency range from 3.3 to 3.8 Ghz.

In various embodiments, the operating range is generally determined by the resonance of the LC resonator circuit 102. The circuit 100 may be designed to pass low power signals from an antenna coupled to the RF common port RFC to a receive path coupled to the RF output port RX, and protect the receive path from high power levels produced when a transmit path coupled to RF input port TX is connected to the antenna. For example, in a transmit mode, a large amount of power (e.g., 100 watts) may be driven by a power amplifier from the input RF (transmit) port TX to the common RF port RFC. However, in a receive mode, the circuit 100 may need to pass low power (e.g., 1 mW, 1 μW, etc.) from the common RF port RFC to the output RF (receive) port RX.

In an example, the inductor 104 may comprise an input matching inductor corresponding to or taking the place of an input matching inductor of a low noise amplifier (LNA) coupled to the RF output port RX. In applications where an input matching inductor is already present as part of the topology of the low noise amplifier block a receiver chain coupled to the circuit 100, the circuit 102 may be implemented by adding the capacitor 106 and the switch 108 across the input matching inductor of the low noise amplifier block.

In an example, the input matching inductor 104 may be coupled between the common RF port RFC and the RF output port RX. The capacitor 106 and the switch 108 may be coupled in series across the input matching inductor 104. In a transmit mode, the switch 108 and the shunt receive switch 94 are generally placed in a conducting state (e.g., closed or ON). In a receive mode, the switch 108 and the shunt receive switch 94 are generally placed in a non-conducting state (e.g., open or OFF).

The circuit 100 generally (a) passes a signal received at the common RF port RFC (e.g., from an antenna) to the RF output port RX (e.g., for presentation to the receive chain) when operating in the receive mode and (b) blocks (e.g., reflects) the signal received at the common RF port RFC when operating in the transmit mode. In general, the inductor 104 is placed in a resonant state by coupling the capacitor 106 across the inductor 104 when operating in the transmit mode. In various embodiments, the capacitor 106 is generally selected to provide parallel resonance with the inductor 104 to produce high impedance at a predetermined frequency band of a transmit signal being presented to the common RF port RFC (e.g., via the series transmit switch 90). In some embodiments, the inductor 104 may be implemented using a high quality factor (High-Q) inductor. High-Q inductors generally help in attaining good noise figures. In an example embodiment, the inductor 104 may be implemented having a quality factor (Q) of about 30. However, other inductors with various quality factors may be utilized to meet the design criteria of a particular application.

In the transmit mode, the switch 108 is generally in the conducting state (e.g., closed or ON). Since the switch 108 is in the conducting state, the switch 108 presents a low equivalent series resistance and, therefore, does not develop a significant voltage drop due to the transmit signal. Because the switch 108 does not develop a significant voltage drop in the transmit mode, the switch 108 may be implemented using a switch device that is smaller than a traditional series receive switch. Since the switch 108 is not in the signal path when the circuit 100 is operating in the receive mode, insertion loss and noise figure ratings of a receiver input are generally not increased by the switch 108. Thus, the circuit 100 generally provides a more robust, more rugged, and lower noise figure front end circuit when compared with conventional front end circuits. Because receiver chains generally already include an input matching inductor and the switch 108 may be smaller than a conventional series receive switch, the circuit 100 may reduce the overall circuit area needed for implementation.

In an example, the circuit 100 may be configured for operation with a single-ended power supply. In an example, a positive supply voltage (e.g., 0-3V) may be used to control (operate) the switches forming the circuit 100. By allowing control using a single-ended supply voltage, a negative voltage generator may be eliminated, further reducing the die area occupied by the front end circuit 100. In an example embodiment, the switches 90, 92, 94, and 108 may be implemented using n-channel metal-oxide-semiconductor (NMOS) transistors. However, many other types of devices and/or technologies (e.g., CMOS, PMOS, SOI, bipolar, SiGe, GaAs, GaN, InN, InP, pHEMT, etc.) may be implemented accordingly to meet the design criteria of a particular implementation. In some embodiments, the switches 92 and 94 may be omitted.

In various embodiments, the inductor 104 may be implemented using any of a variety of techniques and/or technologies including, but not limited to, a coil, a wirebond, a stripline, a transmission line, an integrated spiral inductor, an external component. In various embodiments, the capacitor 106 may be implemented using any of a variety of techniques and/or technologies including, but not limited to, metal-insulator-metal (MIM), external component, integrated passive device (IPV), and compound semiconductor device.

Figure 4:
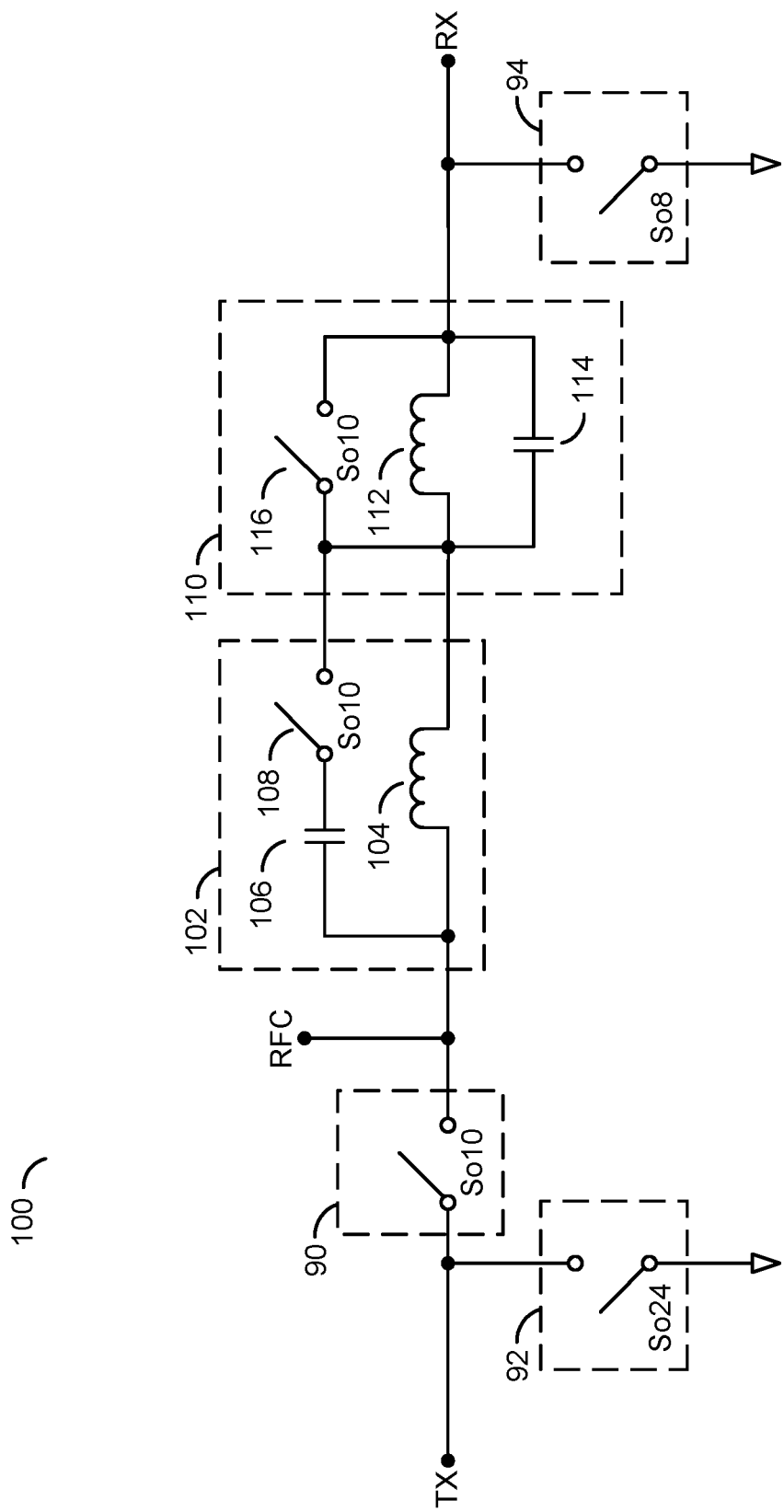
FIG. 4 is a diagram illustrating a high power silicon on insulator (SOI) switch in accordance with another example embodiment of the invention.

Referring to FIG. 4, a diagram of the circuit 100 is shown illustrating a high power switch in accordance with another example embodiment of the invention. In an example, the circuit 100 may be implemented comprising the circuit 102 and a circuit 110. The circuit 110 is generally cascaded with the circuit 102. The term cascaded is used to refer to the circuit 102 and 110 being serially connected or coupled (e.g., between the common RF port RFC and the RF output port RX). The circuit 110 may implement an additional resonator circuit to provide further improvement to the protection provided by the circuit 102 to a receive path of a wireless communication system. The circuit 110 may be implemented using semiconductor technologies including, but not limited to, silicon-on-insulator (SOI) technology and/or complementary metal oxide semiconductor (CMOS) technology.

In an example, the circuit 110 may implement a LC resonator. In an example, the amount of isolation provided by the circuit 100 is generally increased by adding the cascaded LC resonator circuit 110. In an example, the circuit 110 comprises an inductor 112, a capacitor 114, and a switch 116. In various embodiments, the inductor 112 may be implemented using any of a variety of techniques and/or technologies including, but not limited to, a coil, a wirebond, a stripline, a transmission line, an integrated spiral inductor, an external component. In various embodiments, the capacitor 114 may be implemented using any of a variety of techniques and/or technologies including, but not limited to, metal-insulator-metal (MIM), external component, integrated passive device (IPV), and compound semiconductor device. In an example, the switch 116 may comprise a low number (e.g., 10) of stacked switch devices (e.g., transistors). The circuits 102 and 110 generally allows the switch 94 to be implemented with a lower number (e.g., 8) of stacked devices (e.g., transistors) than the shunt receive switch 88 of the traditionally configured switch. In an example, the circuit 100 including both the circuit 102 and the circuit 110 may handle over 44 dBm of input power over the 3.3 to 3.8 Ghz frequency range.

In an example, the inductor 112 may be coupled between an output of the circuit 102 and the RF output port RX. The capacitor 114 and the switch 116 may be coupled in parallel across the inductor 112. In a transmit mode, the switches 108 and 116 and the shunt receive switch 94 are generally placed in a conducting state (e.g., closed or ON). In a receive mode, the switches 108 and 116 and the shunt receive switch 94 are generally placed in a non-conducting state (e.g., open or OFF). In an example, the circuit 102 and 110 may be separate circuits connected in series. In another example, the switches 108 and 116 may be parts of a stack of devices with a tap allowing connection to be made to terminals of the inductor 104, the inductor 112, and the capacitor 114.

Fast switching times (e.g., <0.5 microsecond) may be easily implemented due to the small gate capacitance of a low number (e.g., less than or equal to 10) of stacked devices. In general, the shunt device size is much smaller than the series device size. Good return loss and low insertion loss may be easily obtained due to small parasitic substrate capacitance of the high power silicon on insulator (SOI) switch in accordance with another example embodiment of the invention in the receive path. In an example, the So24 devices in the traditionally configured switch of FIG. 1 may provide a rise time of 1.27 microseconds and a fall time of 1.13 microseconds. Whereas, the two stack-of-10 (So10) devices 108 and 116 from the cascading of the circuit 102 and the circuit 110 may provide reduced rise and fall times (e.g. 0.24 microseconds and 0.4 microseconds, respectively).

Figure 5:
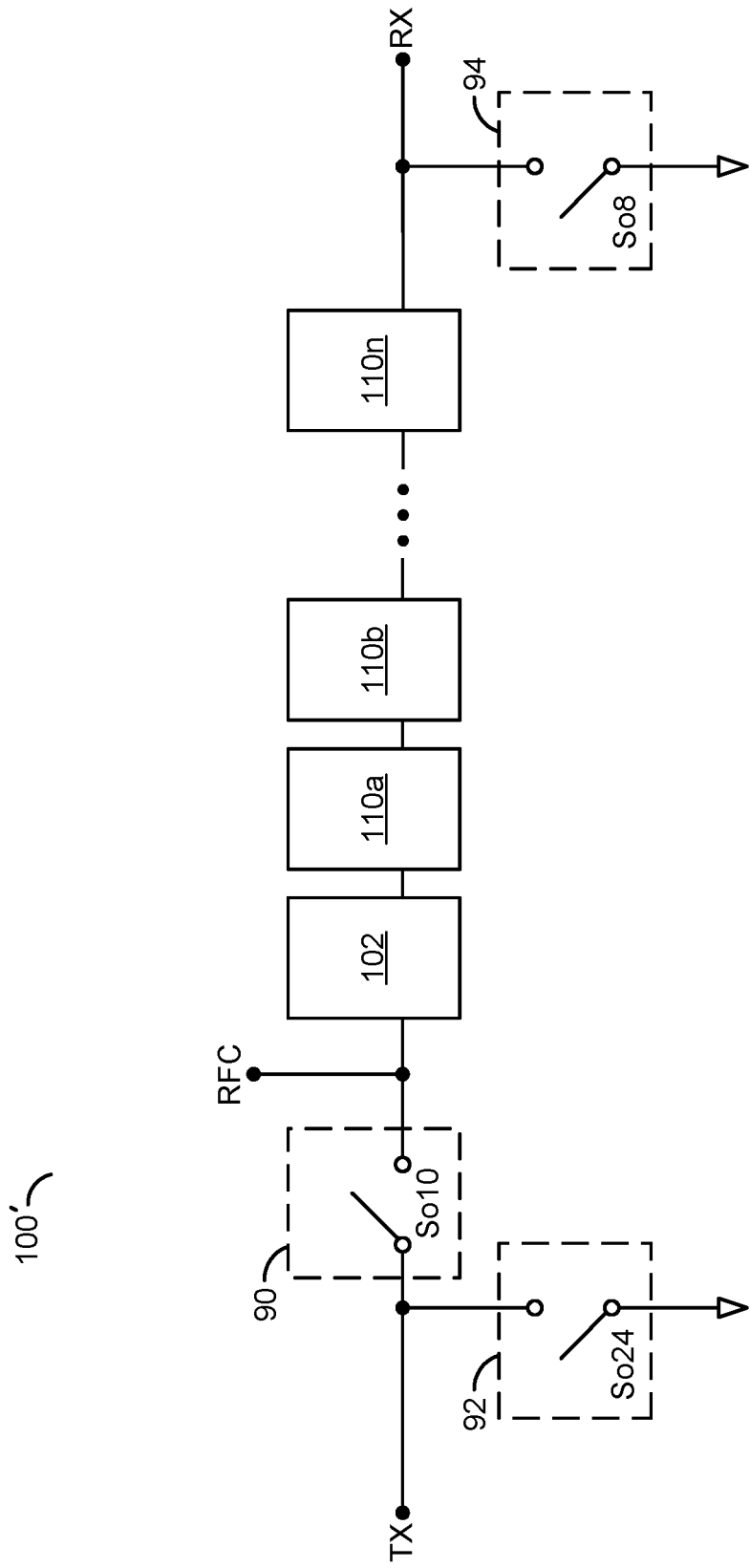
FIG. 5 is a diagram illustrating a high power silicon on insulator (SOI) switch in accordance with another example embodiment of the invention.

Referring to FIG. 5, a diagram of a circuit 100' is shown illustrating a high power switch implemented in accordance with another example embodiment of the invention. In another example, the circuit 100' may incorporate the circuit 102 and a plurality of LC resonator circuits 110a-110n. The circuits 110a-110n are generally implemented as instances of the circuit 110 of FIG. 4. The addition of the plurality of LC resonator circuits 110a-110n generally provides further improvement (e.g., increased isolation) to protect the receive path of a wireless communication system. In various embodiments, any number of the resonator circuits 110 may be cascaded with the circuit 102. In an example, the amount of isolation provided by the circuit 100' may be increased by cascading two or more LC resonator circuits 110a-110n with the circuit 102. The number of cascaded LC resonator circuits 110a-110n and the device stack sizes used in each of the resonator circuits 102 and 110a-110n is generally determined by the maximum input power desired to be handled. In embodiments where good isolation and limited die area are desired, the circuit 100' may be implemented comprising the circuit 102 and two instances of the circuit 110.

Figure 6:
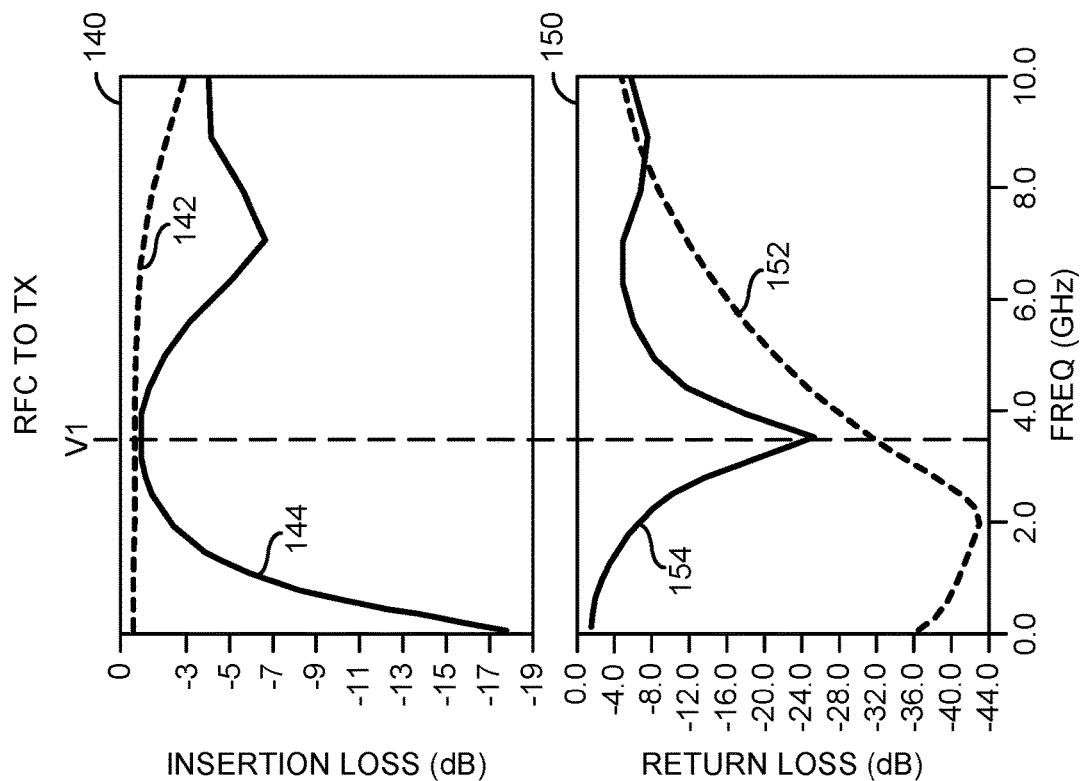
FIG. 6 is a diagram illustrating an S-parameter simulation comparison of insertion loss (IL) and return loss (RL) for the switches of FIGS. 1 and 3.
Figure 6:
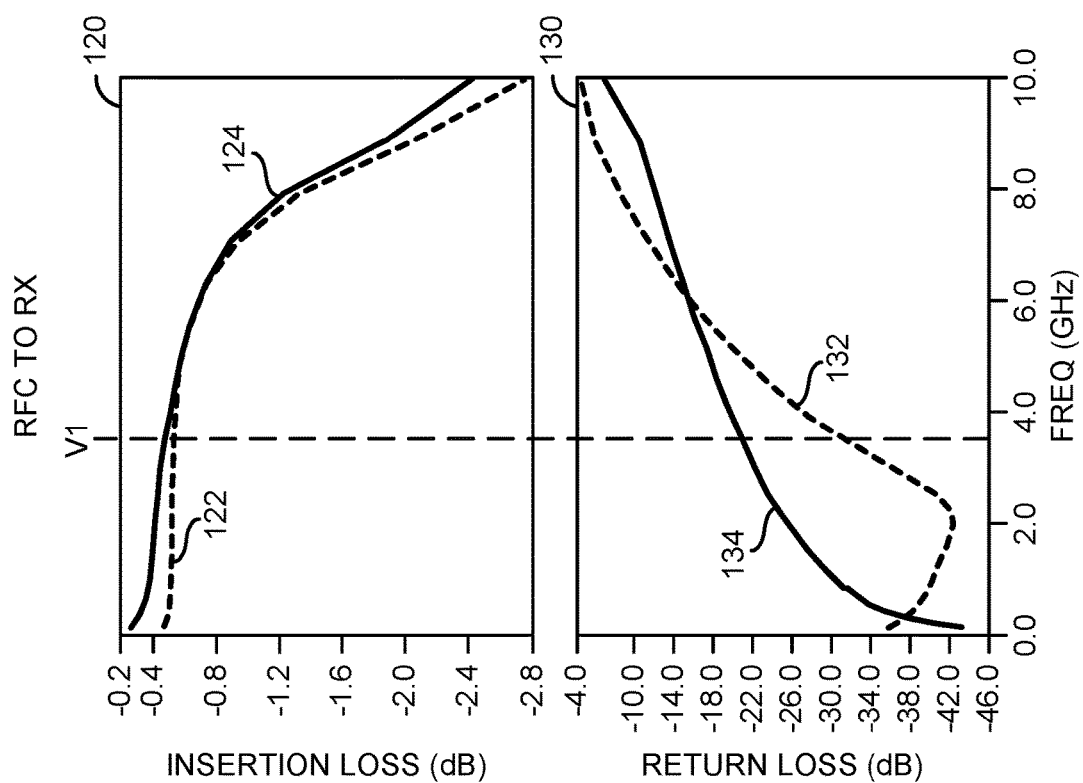

Referring to FIG. 6, a diagram is shown illustrating an S-parameter simulation comparison of insertion loss (IL) and return loss (RL) for the switches 80 and 100 of FIGS. 1 and 3, respectively. Graphs 120 and 130 are shown illustrating insertion loss and return loss, respectively, in a receive (RX) mode (e.g., RFC coupled to RX). Graphs 140 and 150 are shown illustrating insertion loss and return loss, respectively, in a transmit (TX) mode (e.g., RFC coupled to TX). In the graph 120, S-parameter response curves 122 and 124 are shown illustrating insertion loss for a traditionally configured switch and a switch in accordance with an example embodiment of the invention, respectively, in the receive mode (e.g., RFC to RX). In the graph 130, S-parameter response curves 132 and 134 are shown illustrating return loss for a traditionally configured switch and a switch in accordance with an example embodiment of the invention, respectively, in the receive mode. In the graph 140, S-parameter response curves 142 and 144 are shown illustrating insertion loss for a traditionally configured switch and a switch in accordance with an example embodiment of the invention, respectively, in the transmit mode (e.g., RFC to TX). In the graph 150, S-parameter response curves 152 and 154 are shown illustrating return loss for a traditionally configured switch and a switch in accordance with an example embodiment of the invention, respectively, in the transmit mode.

Figure 7:
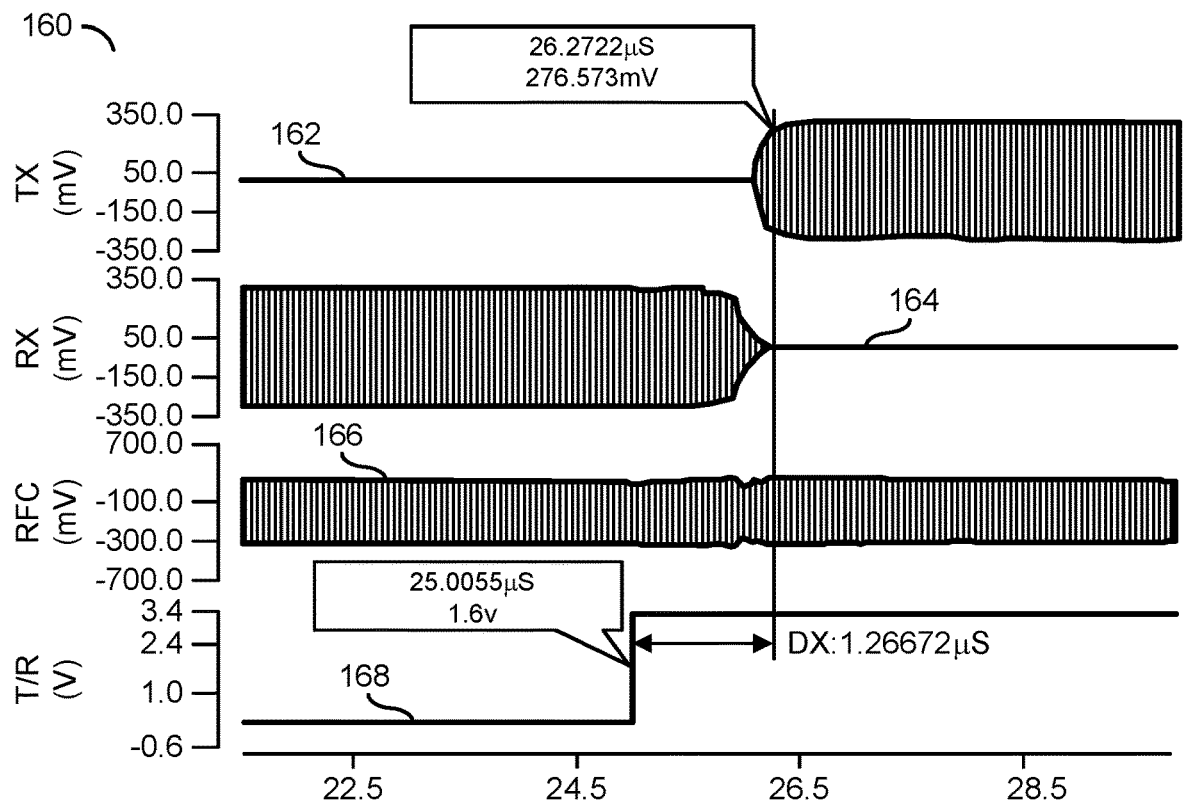
FIG. 7 is a diagram illustrating a transient simulation of switching time for the switch of FIG. 1.
Figure 7:
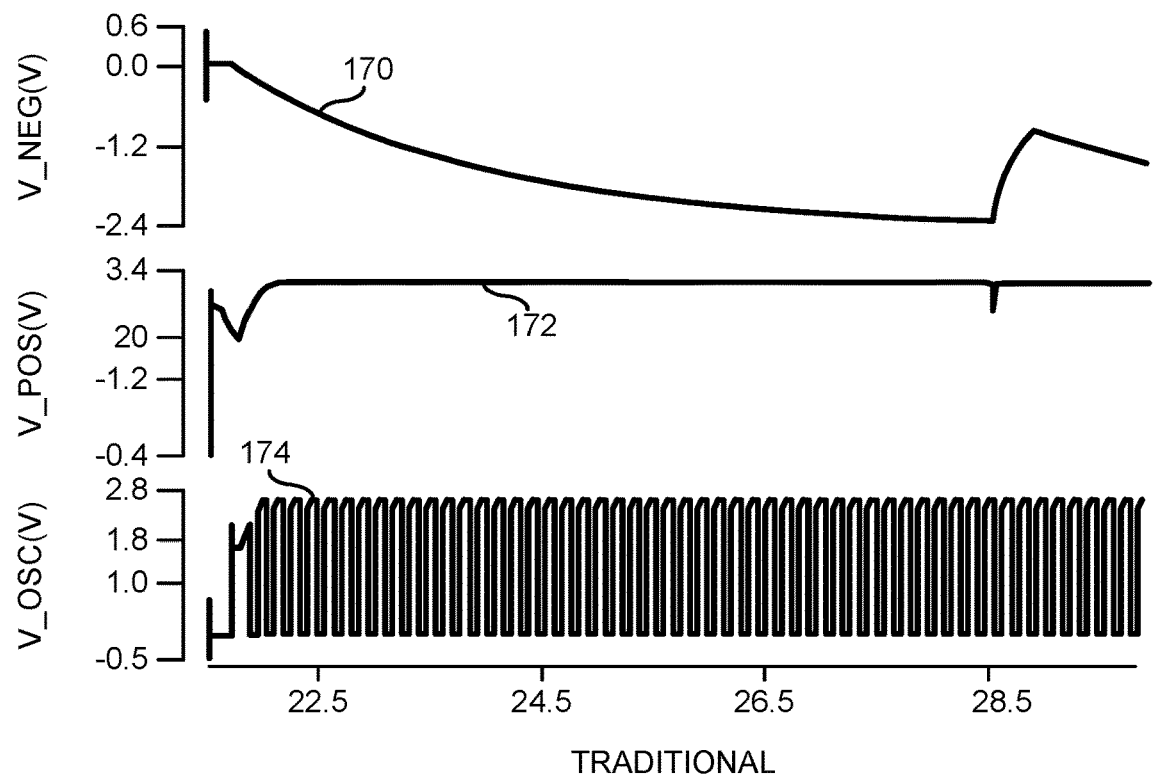

Referring to FIG. 7, a diagram of a graph 160 is shown illustrating an example transient simulation of switching time for the switch 80 of FIG. 1. A curve 162 illustrates a voltage level at the RF input port TX over a period of seven microseconds. A curve 164 illustrates a voltage level at the RF output port RX over the period of microseconds. A curve 166 illustrates a voltage level of an RF signal at the common RF port RFC over the period of microseconds. A curve 168 illustrates a voltage level of a transmit/receive mode control input over the period of microseconds. A curve 170 illustrates a transient response of a negative supply voltage level over the period of microseconds. A curve 172 illustrates a transient response of a positive supply voltage level over the period of microseconds. A curve 174 illustrates a voltage level of an oscillator signal over the period of microseconds. The switching time of the high power switch with So24 devices (FIG. 1) from receive mode to transmit mode is shown comprising a time of about 1.27 microseconds. The switching time of the high power switch with So24 devices from transmit mode to receive mode comprised a time of about 1.13 microseconds (not shown).

Figure 8:
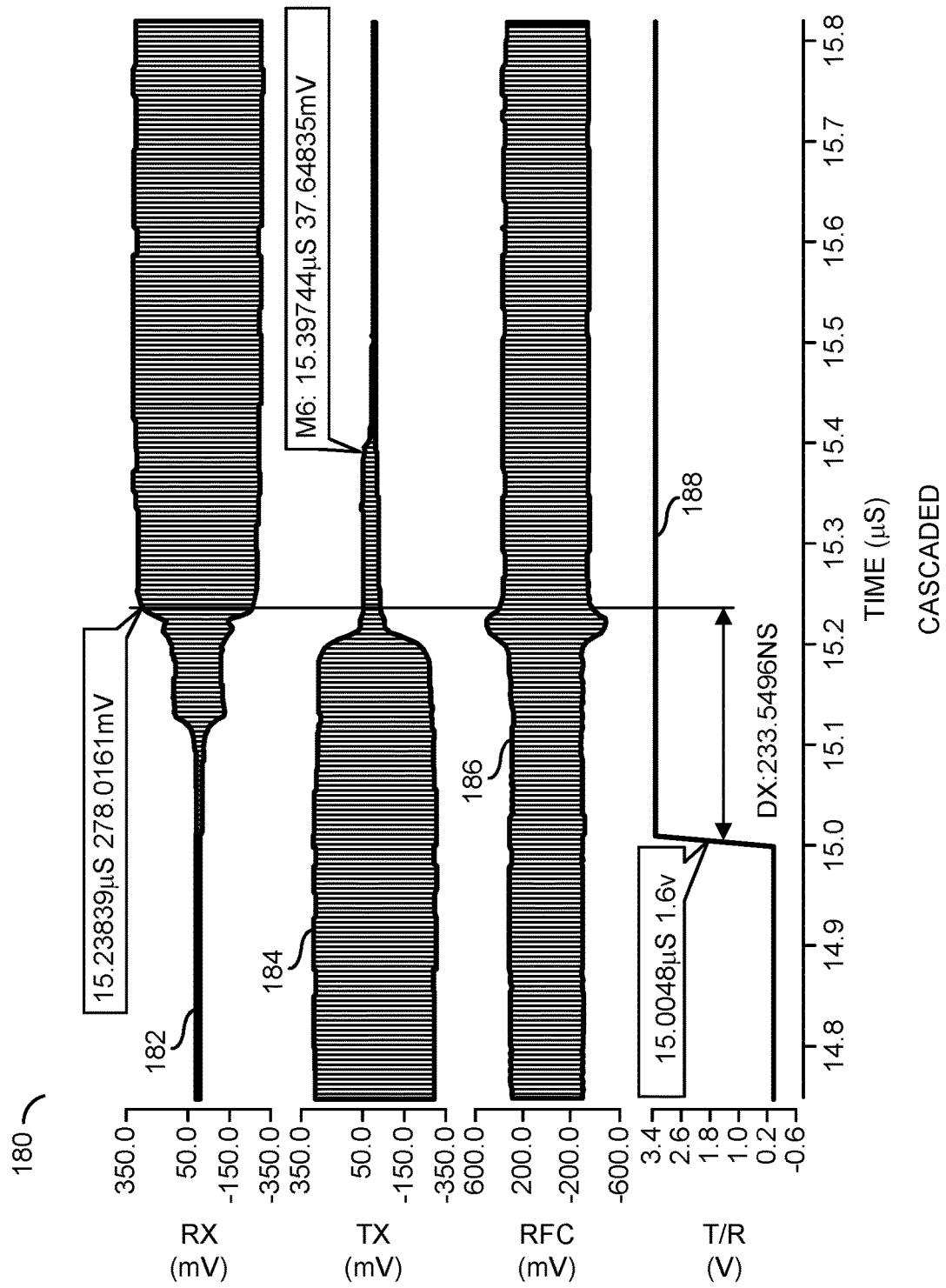
FIG. 8 is a diagrams illustrating a transient simulation of switching time for the switch of FIG. 3.

Referring to FIG. 8, a diagram of a graph 180 is shown illustrating a transient simulation comparison of switching time for the switch 100 of FIG. 3. A curve 182 illustrates a voltage level at the RF output port RX over a period of about one microsecond. A curve 184 illustrates a voltage level at the RF input port TX over the approximately one microsecond period. A curve 186 illustrates a voltage level of an RF signal at the common RF port RFC over the approximately one microsecond period. A curve 188 illustrates a voltage level of a transmit/receive mode control input over the approximately one microsecond period. The switching time from transmit mode to receive mode of the high power switch 100 with So10 devices configured in accordance with an example embodiment of the invention is shown comprising a time of about 0.24 microseconds. The switching time of the high power switch 100 from receive mode to transmit mode comprised a time of about 0.4 microseconds (not shown).

Figure 9:
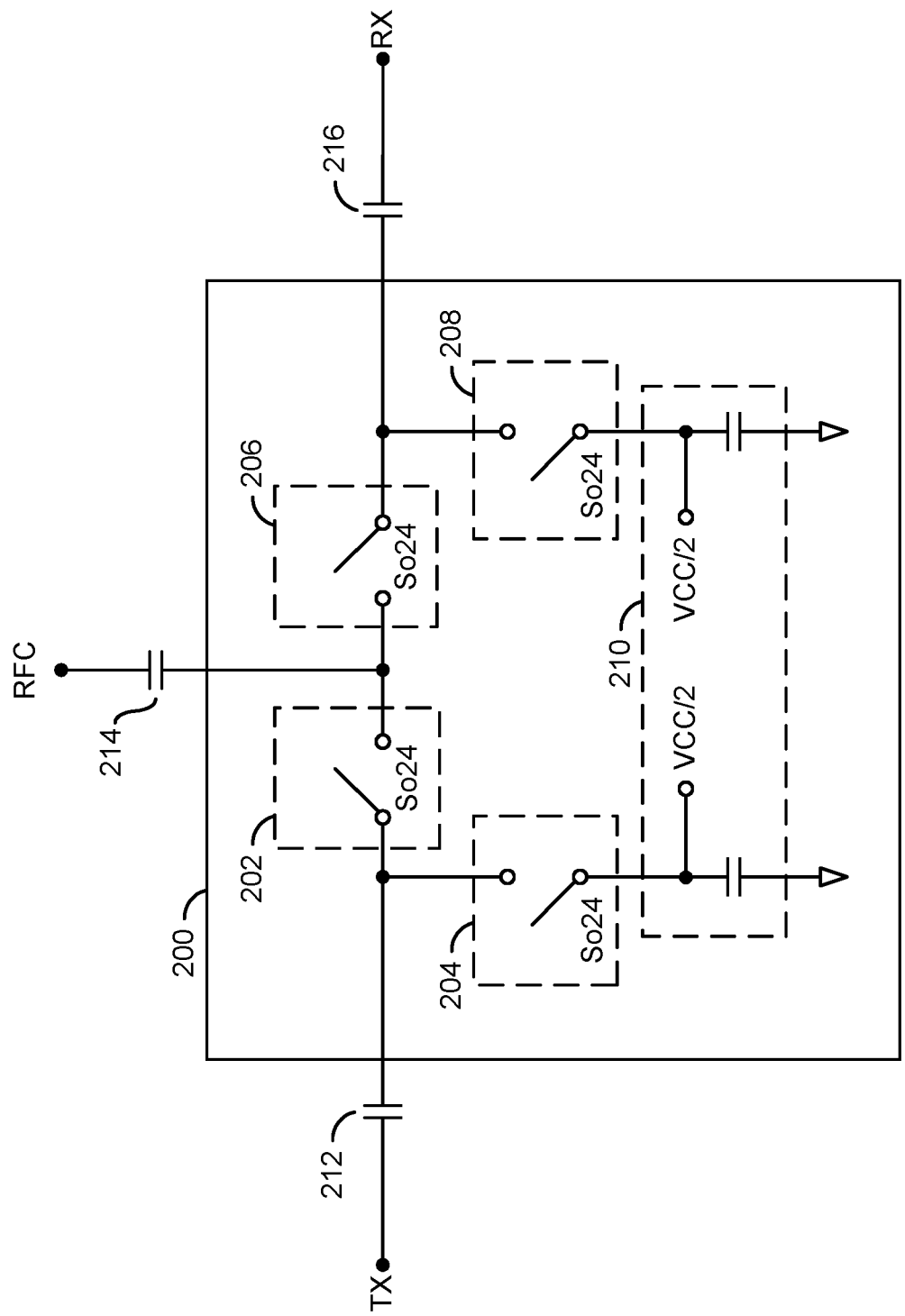
FIG. 9 is a diagram illustrating a high power silicon on insulator (SOI) switch in accordance with still another example embodiment of the invention.

Referring to FIG. 9, a diagram of a circuit 200 is shown illustrating a high power switch in accordance with still another example embodiment of the invention. In an example, the circuit 200 may be implemented using semiconductor technologies including, but not limited to, silicon-on-insulator (SOI) technology and/or complementary metal oxide semiconductor (CMOS) technology. The circuit 200 may be implemented similarly to the circuit 80 of FIG. 1, except that the circuit 200 may include a DC blocking capacitor and a half supply voltage (e.g., VCC/2) tab at both shunt device paths in addition to external DC blocking capacitors on the RF ports. In embodiments where the particular process technology has capacitors with high breakdown voltage available, the external DC blocking capacitors may be integrated on-chip. The capacitor size utilized generally depends on the application frequency. The circuit 200 may allow integration with other building blocks by using CMOS technology.

In an example, the circuit 200 may comprise a series transmit switch 202, a shunt transmit switch 204, a series receive switch 206, a shunt receive switch 208, and a circuit 210. The circuit 210 generally comprises the DC blocking capacitors and half supply voltage (e.g., VCC/2) tabs. The switches 202, 204, 206, and 208 are generally implemented using large numbers (e.g., 24) of series connected (or stacked) devices (e.g., transistors). However, other numbers of stacked devices may be used to meet design criteria of a particular application. The switch 200 generally occupies a large die area due to the high number of stacked devices.

In an example, the switches 202, 204, 206, and 208 are used to route signals between the RF input port TX, the RF output port RX, and the common RF port RFC. In an OFF state, the switch 206 needs to withstand the high input power levels (e.g., over 40 dBm) generally associated with transmitting wireless communications signals. In the OFF state, the relatively high input voltage is spread out among the individual devices in the stack of the switch 206, reducing the voltage across each individual device, in order to prevent breakdown.

In an example, an output of a transmit chain may be coupled to a first terminal of the series transmit switch 202 and a first terminal of the shunt transmit switch 204 via an external DC blocking capacitor 212. A second terminal of the series transmit switch 202 may be coupled to the RF common port (RFC) and a first terminal of the series receive switch 206. In an example, the RF common port RFC may be connected to an antenna or a transmission line via an external DC blocking capacitor 214. A second terminal of the series receive switch 206 may be coupled to a first terminal of the shunt receive switch 208 and the RF output port RX. In an example, an input of a receive chain may be coupled to the RF output port RX via an external DC blocking capacitor 216. A second terminal of the shunt transmit switch 204 is coupled to the circuit ground potential by a first DC blocking capacitor. The half supply voltage VCC/2 is applied to a node formed by the connection of the second terminal of the shunt transmit switch 204 and a terminal of the first DC blocking capacitor. A second terminal of the shunt transmit switch 208 is coupled to the circuit ground potential by a second DC blocking capacitor. The half supply voltage VCC/2 is applied to a node formed by the connection of the second terminal of the shunt transmit switch 208 and a terminal of the second DC blocking capacitor. The first and second DC blocking capacitors are generally integrated on the same chip as the switches.

Fast switching time (e.g., <0.5 microseconds) may be possible by removing negative and positive supply voltage with a certain degree of degradation of insertion loss. Negative gate bias voltage suffers the big slump at the switching event due to large gate capacitance of series and shunt devices. Such negative bias slump may degrade the switching time. The power handling may be improved possibly through the strong positive (VCC) and negative gate bias voltage (Ground). The strong gate bias voltage generally strengthens the ON or OFF state of the switch devices, which may improve power handling.

The circuit 200 generally does not need a negative voltage generator. Since the negative voltage generator is eliminated, the circuit 200 generally does not contain any spurious signals. This may improve RF system performance such as noise factor (NF) or linearity. In another example, a stack of 24 (So24) traditionally configured high power switch may provide a rise time of 0.54 microseconds and a fall time of 0.3 microseconds. Whereas, a stack of 24 (So24) high power switch implemented in accordance with another example embodiment of the invention may provide a switch time from receive mode to transmit mode or transmit mode to receive mode of about 0.38 microseconds.

Figure 10:
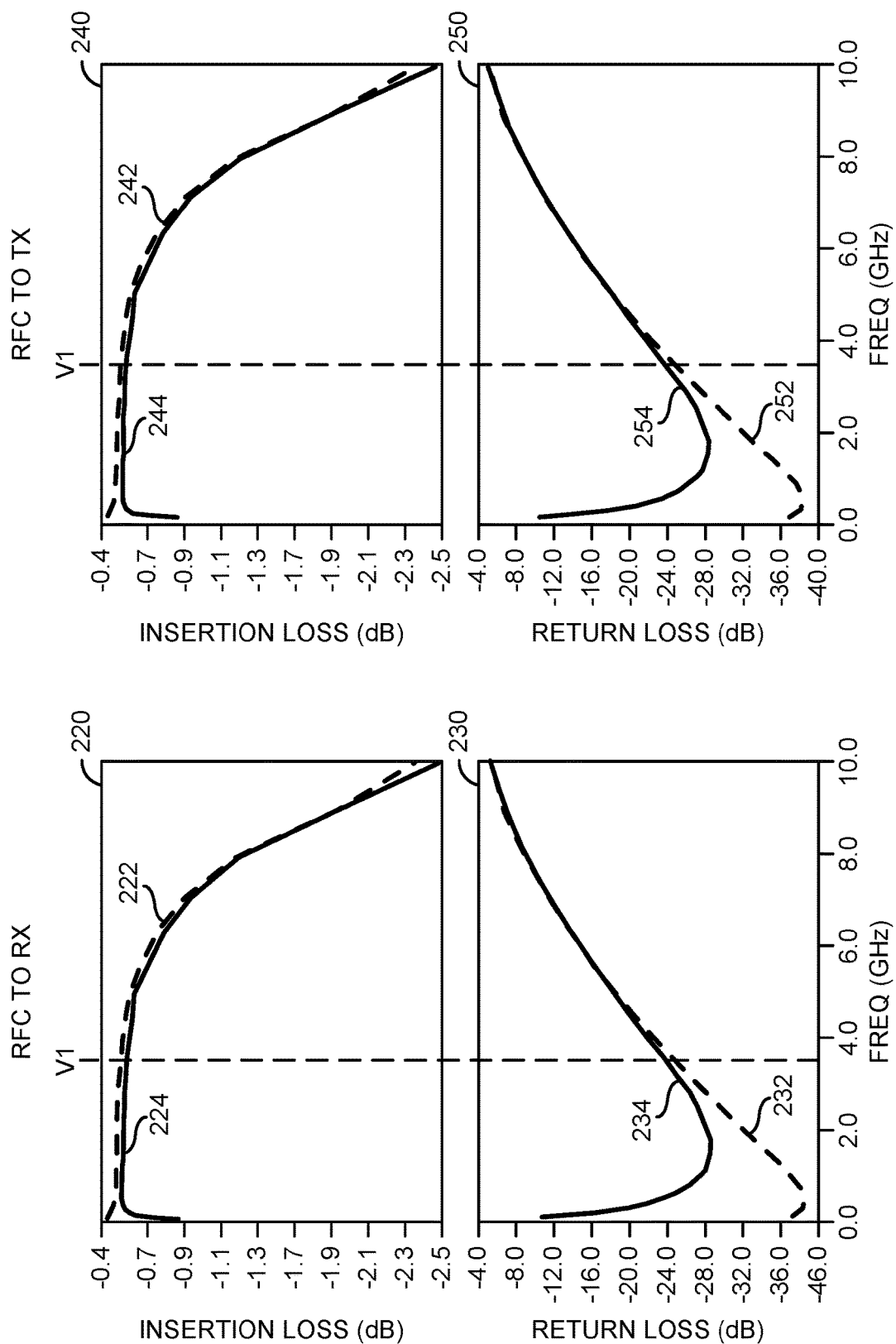
FIG. 10 is a diagram illustrating an S-parameter simulation comparison of insertion loss (IL) and return loss (RL) for the switches of FIGS. 1 and 9.

Referring to FIG. 10, a diagram is shown illustrating another S-parameter simulation comparison of insertion loss (IL) and return loss (RL) for the switches 80 and 200 of FIGS. 1 and 9, respectively. Graphs 220 and 230 are shown illustrating insertion loss and return loss in a receive (RX) mode. Graphs 240 and 250 are shown illustrating insertion loss and return loss in a transmit (TX) mode. In the graph 220, S-parameter response curves 222 and 224 are shown illustrating insertion loss for a traditionally configured switch 80 and the switch 200 in accordance with an example embodiment of the invention, respectively, in the receive mode (e.g., RFC to RX). In the graph 230, S-parameter response curves 232 and 234 are shown illustrating return loss for a traditionally configured switch 80 and the switch 200 in accordance with an example embodiment of the invention, respectively, in the receive mode. In the graph 240, S-parameter response curves 242 and 244 are shown illustrating insertion loss for a traditionally configured switch 80 and the switch 200 in accordance with an example embodiment of the invention, respectively, in the transmit mode (e.g., RFC to TX). In the graph 250, S-parameter response curves 252 and 254 are shown illustrating return loss for a traditionally configured switch 80 and the switch 200 in accordance with an example embodiment of the invention, respectively, in the transmit mode. The switch with the traditional configuration generally comprises a switching rise time of 0.54 microseconds. The switch with the configuration in accordance with the embodiment illustrated in FIG. 9 generally has a switching time of about 0.38 microseconds.

Figure 11:
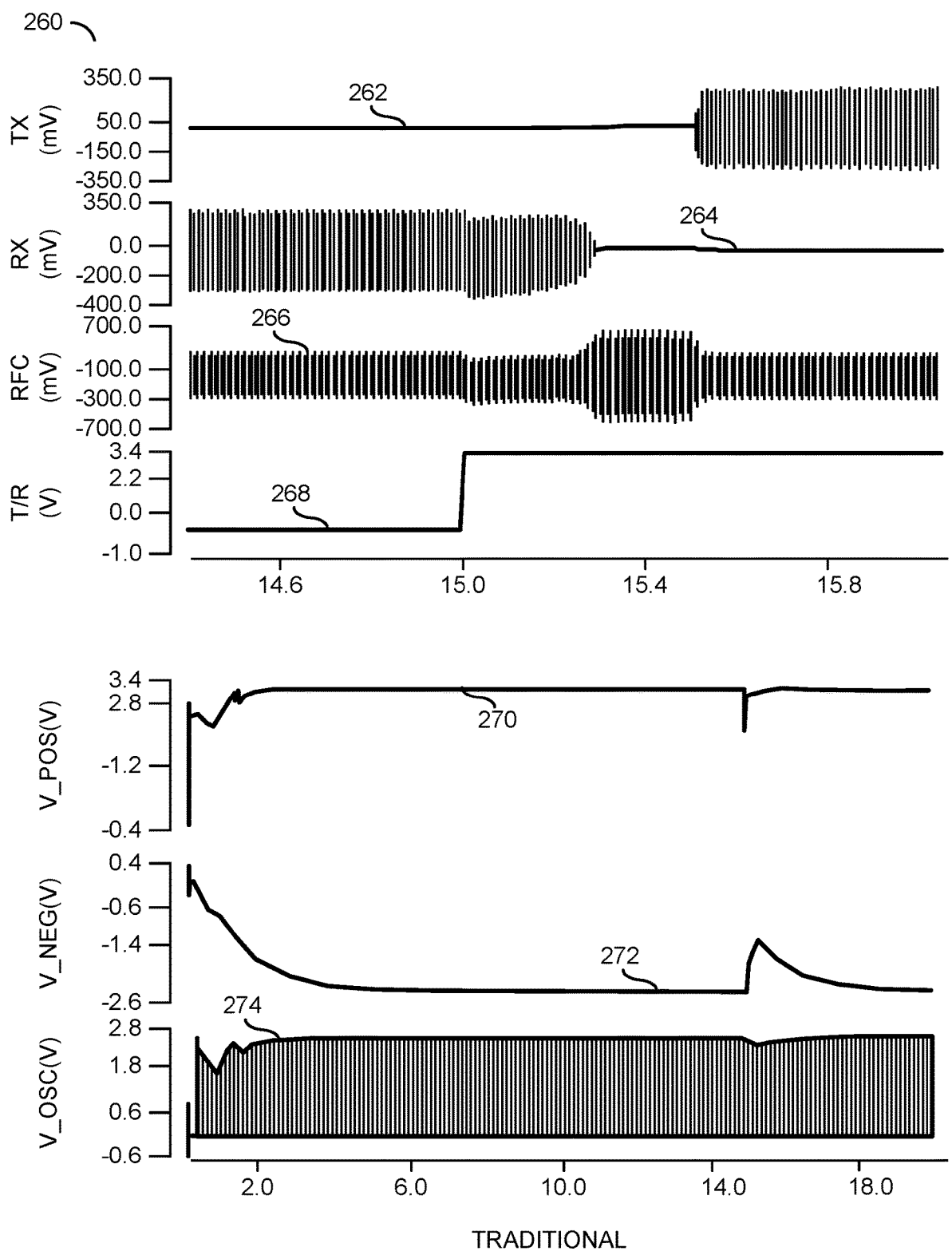
FIG. 11 is a diagram illustrating a transient simulation of switching time for another example implementation of the switch of FIG. 1.

Referring to FIG. 11, a diagram of a graph 260 is shown illustrating another example transient simulation of switching time for the switch 80 of FIG. 1. A curve 262 illustrates a voltage level at the RF input port TX over a period of about one and a half microseconds. A curve 264 illustrates a voltage level at the RF output port RX over the period. A curve 266 illustrates a voltage level of an RF signal at the common RF port RFC over the period. A curve 268 illustrates a voltage level of a transmit/receive mode control input over the period. A curve 270 illustrates a transient response of a positive supply voltage level over a period of about 20 microseconds. A curve 272 illustrates a transient response of a negative supply voltage level. A curve 274 illustrates a voltage level of an oscillator signal. The switching time of the high power switch with So24 devices (FIG. 1) from receive mode to transmit mode is shown comprising a time of about 0.54 microseconds.

Figure 12:
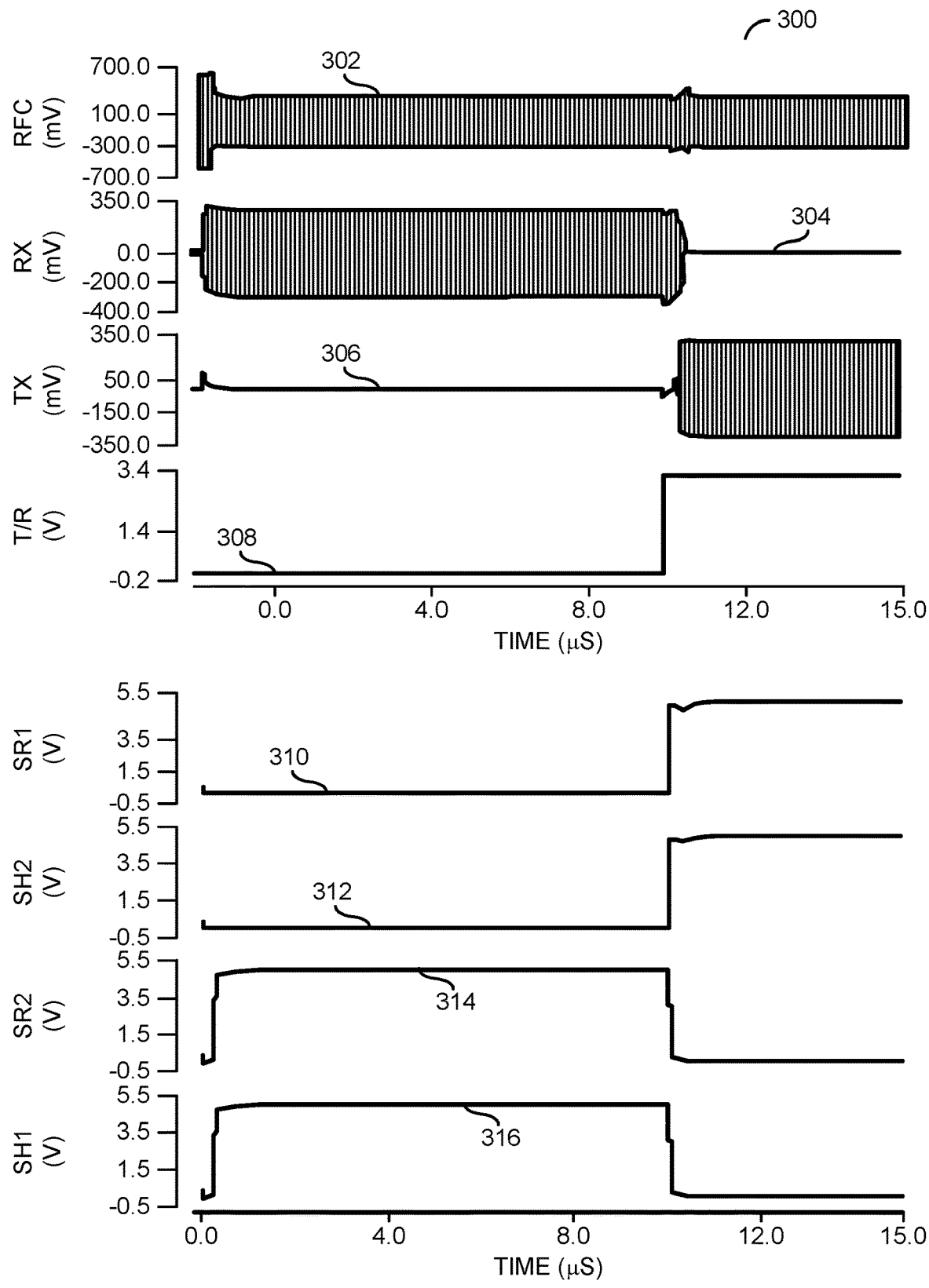
FIG. 12 is a diagram illustrating a transient simulation of switching time for the switch of FIG. 9.

Referring to FIG. 12, a diagram of a graph 300 is shown illustrating an example of a transient simulation of switching time for the half supply biased switch 200 of FIG. 9. A curve 302 illustrates a voltage level of an RF signal at the common RF port RFC over a period of about 15 microseconds. A curve 304 illustrates a voltage level at the RF output port RX over the period of about 15 microseconds. A curve 306 illustrates a voltage level at the RF input port TX over the period of about 15 microseconds. A curve 308 illustrates a voltage level of a transmit/receive mode control input over the an oscillator signal. A curve 310 illustrates a voltage level of a control input (e.g., SR1) of the switch 202. A curve 312 illustrates a voltage level of a control input (e.g., SH2) of the switch 208. A curve 314 illustrates a voltage level of a control input (e.g., SR2) of the switch 206. A curve 316 illustrates a voltage level of a control input (e.g., SH1) of the switch 204. The switching time from transmit mode to receive mode or from receive mode to transmit mode of the high power switch 200 in accordance with an example embodiment of the invention generally comprises a time of about 0.38 microsecond.

Although embodiments of the invention may have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, etc.) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

What is claimed is:

1. An apparatus comprising:
    an RF input port;
    an RF output port;
    an RF common port;
    a series transmit switch connected between said RF input port and said RF common port;
    a first resonator circuit; and
    a second resonator circuit, wherein the first resonator circuit and the second resonator circuit are connected in series between the RF common port and the RF output port, the first resonator circuit comprises a first inductor, a first capacitor, and a first stacked switch device, the second resonator circuit comprises a second inductor, a second capacitor, and a second stacked switch device, the first capacitor and the first stacked switch device are coupled in series across the first inductor, and the second capacitor, the second inductor, and the second stacked switch device are connected in parallel.

2. The apparatus according to claim 1, wherein said second resonator circuit increases an input power handling capability of the apparatus over a particular frequency range.

3. The apparatus according to claim 1, further comprising one or more additional second resonator circuits connected in series with the first resonator circuit and the second resonator circuit.

4. The apparatus according to claim 3, wherein a total number of second resonator circuits connected in series and a number of stacked devices is determined based on a maximum input power of the apparatus.

5. The apparatus according to claim 3, wherein each additional second resonator circuit further increases an input power handling capability of the apparatus over a particular frequency range.

6. The apparatus according to claim 3, wherein each additional second resonator circuit added in series with the first resonator circuit and the second resonator circuit increases an amount of isolation provided by the first resonator circuit.

7. The apparatus according to claim 3, wherein the one or more additional second resonator circuits reduce parasitic substrate capacitance and increase a switching speed of the apparatus.

8. The apparatus according to claim 3, wherein the one or more additional second resonator circuits reduce switching times for switching the apparatus between a receive mode and a transmit mode.

9. The apparatus according to claim 3, wherein the one or more additional second resonator circuits improve insertion loss and return loss by reducing parasitic substrate capacitances of the apparatus.

10. The apparatus according to claim 3, wherein the one or more additional second resonator circuits reduce a trade off between an insertion loss and a switching speed of the apparatus.

11. The apparatus according to claim 1, further comprising a third stacked switch device connected between the RF output port and a circuit ground potential.

12. The apparatus according to claim 11, further comprising a fourth stacked switch device connected between the RF input port and the circuit ground potential.

13. The apparatus according to claim 1, wherein the first stacked switch device and the second stacked switch device are in a conducting state when the apparatus is in a transmit mode.

14. The apparatus according to claim 1, wherein the first stacked switch device and the second stacked switch device are in a non-conducting state when the apparatus is in a receive mode.

15. The apparatus according to claim 1, wherein the first stacked switch device and the second stacked switch device are parts of a stack of devices with a tap allowing connection to be made to terminals of the first inductor, the second inductor, and the second capacitor.

16. The apparatus according to claim 1, wherein the apparatus is implemented utilizing at least one of silicon-on-insulator technology and complementary metal oxide semiconductor technology.

17. The apparatus according to claim 1, wherein the apparatus is part of a wireless communication system.

18. The apparatus according to claim 1, wherein the first stacked switch device and the second stacked switch device comprise a plurality of transistors connected in series.

19. The apparatus according to claim 18, wherein the plurality of transistors comprise field effect transistors.

20. An apparatus comprising:
a first RF port;
a second RF port;
a first resonator circuit; and
two or more second resonator circuits, wherein the first resonator circuit and the second resonator circuits are connected in series between the first RF port and the second RF port, the first resonator circuit comprises a first inductor, a first capacitor, and a first stacked switch device, each of the second resonator circuits comprises a second inductor, a second capacitor, and a second stacked switch device, the first capacitor and the first stacked switch device are coupled in series across the first inductor, and the second capacitor, the second inductor, and the second stacked switch device of each of the second resonator circuits are connected in parallel.

* * * * *